United States Patent [19]
Hausmann

[11] Patent Number: 6,067,222
[45] Date of Patent: May 23, 2000

[54] SUBSTRATE SUPPORT APPARATUS AND METHOD FOR FABRICATING SAME

[75] Inventor: Gilbert Hausmann, Ben Lomond, Calif.

[73] Assignee: Applied Materials, Inc., Santa Clara, Calif.

[21] Appl. No.: 09/200,103

[22] Filed: Nov. 25, 1998

[51] Int. Cl.[7] ................................................. H02N 13/00
[52] U.S. Cl. ............................................ 361/234; 279/128
[58] Field of Search ................................. 361/230–235; 279/128

[56] References Cited

U.S. PATENT DOCUMENTS 5,384,682  1/1995  Watanabe et al. ..................... 361/234

*Primary Examiner*—Fritz M. Fleming
*Attorney, Agent, or Firm*—Thomason, Moser & Patterson

[57] ABSTRACT

An apparatus for retaining a substrate and method of fabricating same. Specifically, a Johnsen-Rahbek effect electrostatic chuck comprising a chuck body, at least one electrode disposed within said chuck body and a barrier formed around said at least one electrode. The barrier is fabricated of a material selected from the group consisting of conductive materials and semiconductive materials and in one instance is an alloy of a material of which the electrode is fabricated. Alternately, the barrier is formed of a dielectric material that is not the same material of which the chuck body is fabricated. The resultant apparatus provides an electrostatic chuck that has a reduced charge accumulation effect at the electrode/chuck body interface. Reducing charge accumulation maintains the desired electrostatic chucking forces in such a device.

24 Claims, 3 Drawing Sheets

SUBSTRATE SUPPORT APPARATUS AND METHOD FOR FABRICATING SAME

BACKGROUND OF THE INVENTION

1. Field of the Invention

The invention relates generally to an improved substrate support apparatus and more specifically to an electrostatic chuck with barrier enhanced electrodes for reducing the charge accumulation phenomenon within the chuck.

2. Description of the Background Art

Electrostatic chucks are used for retaining a workpiece in a variety of applications including securing a substrate (i.e., a semiconductor wafer) within a semiconductor wafer process chamber. Although electrostatic chucks vary in design, they all are based on the principle of applying a voltage to one or more electrodes in the chuck so as to induce opposite polarity charges in the workpiece and electrodes, respectively. The electrostatic attractive force between the opposite charges presses the workpiece against the chuck, thereby retaining the workpiece.

In semiconductor wafer processing equipment, electrostatic chucks are used for securing or clamping wafers to a pedestal located within the process chamber. The pedestal is provided with additional equipment, e.g., heaters, heat sinks, heat transfer gas ports, additional electrodes and the like to regulate temperature, electrical bias and other chamber conditions during wafer processing to optimize yield. During a typical wafer processing cycle, a wafer is introduced to a process chamber and disposed on a support surface of the electrostatic chuck. The electrodes are energized with a chucking voltage for a period of time which can be from a few milliseconds to up to 30 seconds during which wafer processing (i.e., physical vapor deposition (PVD), chemical vapor deposition (CVD), chemical mechanical polishing (CMP) or the like) is performed. Subsequently, the electrodes are de-energized and the wafer removed from the process chamber.

Ideally, there are no residual or accumulated charges retained in the electrostatic chuck when the electrodes are de-energized. As such, the wafer is easily removed from the support surface of the electrostatic chuck. In other words, a residual charge accumulation in the electrostatic chuck creates a residual chucking force that must be overcome before the wafer can be removed from the chamber. If excessive force is used to overcome the residual chucking force, the wafer may crack, break, have damaged circuit devices thereupon or the like. Residual charges are also detrimental because they reduce the available chucking force for retaining a wafer on the support surface. This condition, in turn, results in poor process conditions. For example, a reduced chucking force can contribute to a non-uniform heat transfer gas pressure applied to the backside of the wafer. Such unequal forces cause wafer shifting or pop-off and compromises temperature control which results in poor process conditions or particle contamination. Additionally, during the course of batch processing, it becomes increasingly difficult to "dechuck" or remove a processed wafer due to the accumulation of these charges in the electrostatic chuck.

FIG. 1 depicts a typical, bipolar electrostatic chuck 100 used for supporting and retaining a substrate such as a semiconductor wafer 106 in a process chamber (not shown). The chuck 100 has a chuck body 102 usually formed of a dielectric material such as aluminum nitride or boron nitride with one or more electrodes $108_1$ and $108_2$ disposed within the chuck body 102. A power source 110 is connected to and oppositely biases each of the electrodes to establish the desired electrostatic field and chucking force. As such, the wafer 106 is retained upon a support surface 104 of the electrostatic chuck.

In some instances, the electrodes are fabricated from molybdenum which is a desired material because of its electrical properties and relatively close thermal expansion coefficient with respect to the aluminum nitride chuck body. However, it has been noticed that when a negative potential is applied to a molybdenum-based electrode in an aluminum nitride body, the potential at the support surface above the negative electrode degrades or is otherwise reduced with respect to the potential applied to the positive electrode and seen at the support surface above the positive electrode.

FIG. 2 depicts this phenomenon in greater detail. Specifically, FIG. 2 depicts a graph 200 of time (in seconds) vs. potential (in volts) at the support surface 104 above the positive and negative electrodes of electrostatic chuck 100. Section A of the graph 200 corresponds to the period of time t where $0<t<T1$ and the chucking voltage applied to the electrodes is zero. Section B corresponds to a time t where $T1<t<T2$ where a positive chucking voltage is applied to the positive electrode $108_1$ (line 202) and a negative chucking voltage is applied to the negative electrode $108_2$ (line 204). As seen, once the chucking voltage is applied, the positive voltage maintains a steady state value. The negative voltage however, first reaches a value approximately equal in magnitude to the positive value (but opposite in sign of course) and then decays to a less negative (i.e., more positive) value. This change in potential at the support surface is denoted as $\Delta V_n$. Section C corresponds to a time t where $t>T2$ and the chucking voltage has been turned off. The positive voltage rapidly drops to zero and may have a slight, but relatively insignificant residual value. The negative value however, overshoots the Y=0 axis by a value of approximately $\Delta V_n$ and begins a slow decay.

The reduced negative potential seen in Section B is undesirable because of reduced chucking force at the surface. This same condition is undesirable in Section C because of the inability to rapidly remove (or "dechuck") a wafer from the support surface. Additionally, it has been noted that disconnecting power to or temporarily reversing the polarity of electrodes does not relieve this condition. It is suggested that the value $\Delta V_n$ is created by an electrochemical process between the electrode/chuck body interface so that a localized positive charge continuously exists within the chuck body. In effect, the proximity of the molybdenum electrodes to the aluminum nitride chuck body creates an accumulated charge or internal battery condition that is deleterious to electrostatic chucking forces. Specifically, a repelling force created by the positive charge at what should be a negatively charged region compromises chucking forces and may even force the wafer off the substrate support entirely.

Therefore, there is a need in the art for an improved electrostatic chuck that is not subject to undesirable charge accumulation after repeated use.

SUMMARY OF THE INVENTION

The disadvantages heretofore associated with the prior art are overcome by the present invention of an apparatus for retaining a substrate and method of fabricating same. Specifically, the present invention is an electrostatic chuck comprising a chuck body, at least one electrode disposed within said chuck body and a barrier formed around said at least one electrode. Preferably the chuck body is fabricated of a non-pure dielectric material such as doped aluminum nitride for the purposes of facilitating the Johsen-Rahbek effect and the electrode is fabricated of a conductive material such as molybdenum. The barrier is fabricated of a material selected from the group consisting of conductive materials and semiconductive materials and in one instance is an alloy of a material of which the electrode is fabricated such as molybdenum nitride. In an alternate embodiment of the invention, the barrier is formed of a dielectric material that is not the same material of which the chuck body is fabricated. Such alternate barrier materials can be boron nitride, tantalum nitride and titanium nitride also doped so that they have a finite resistance and can produce the Johnsen-Rahbek effect.

A method for forming the electrostatic chuck includes the steps of providing at least one electrode, forming a barrier around the one electrode and providing the barrier/electrode combination within the chuck body. The electrode is fabricated from tungsten or molybdenum that is coated with a conductive or semiconductive barrier material. The coating is performed by various possible methods including but not limited to physical vapor deposition, chemical vapor deposition, flame spraying, electroplating, heat annealing and plasma annealing. In a preferred embodiment of the subject method, the barrier material is an alloy of a material for forming the electrode such as molybdenum nitride. In an alternate embodiment, the barrier is formed from a non-pure dielectric material that is not the same non-pure dielectric material from which the chuck body was fabricated. For example, the barrier dielectric material is tantalum nitride and the chuck body material is aluminum nitride, both having dopants added for a finite resistance characteristic.

The above discussed method and resultant apparatus provides an electrostatic chuck that has a reduced charge accumulation effect at the electrode/chuck body interface. The importance of such a structure is realized in that reduced charge accumulation reduces the "battery effect" from forming at one of the electrodes. Such a battery effect weakens or otherwise degrades the desired electrostatic chucking forces.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
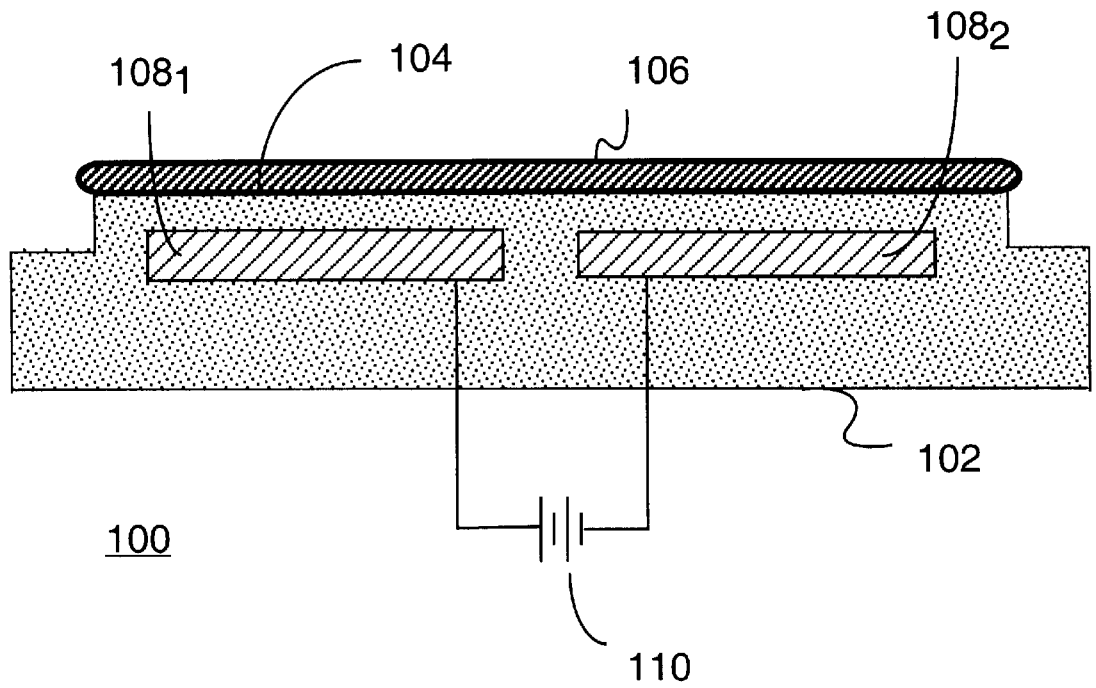
FIG. 1 depicts a cross sectional view of a prior art bipolar electrostatic chuck.
Figure 3:
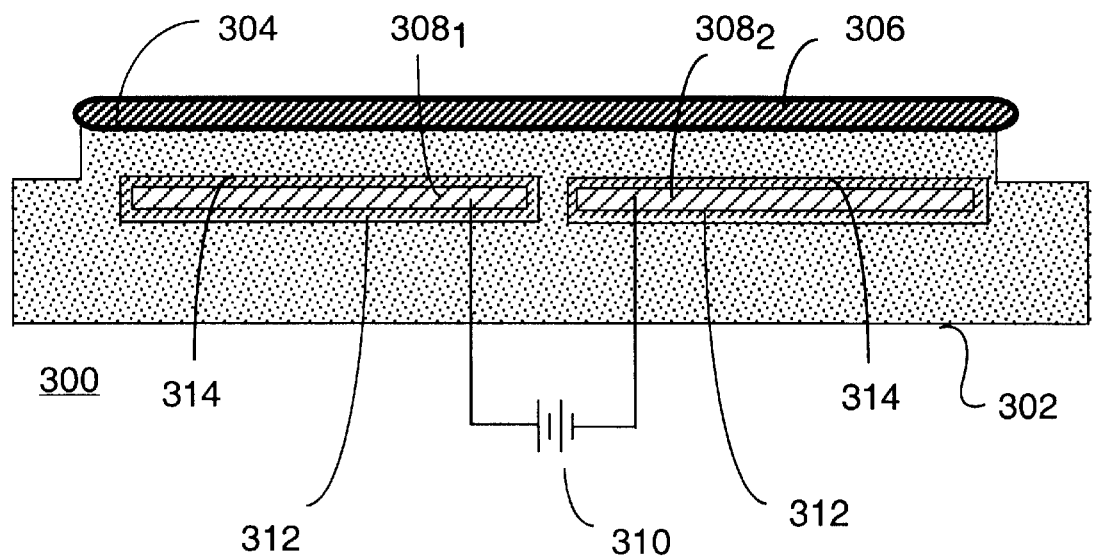
FIG. 3 depicts a cross sectional view of an apparatus in accordance with the subject invention.
Figure 2:
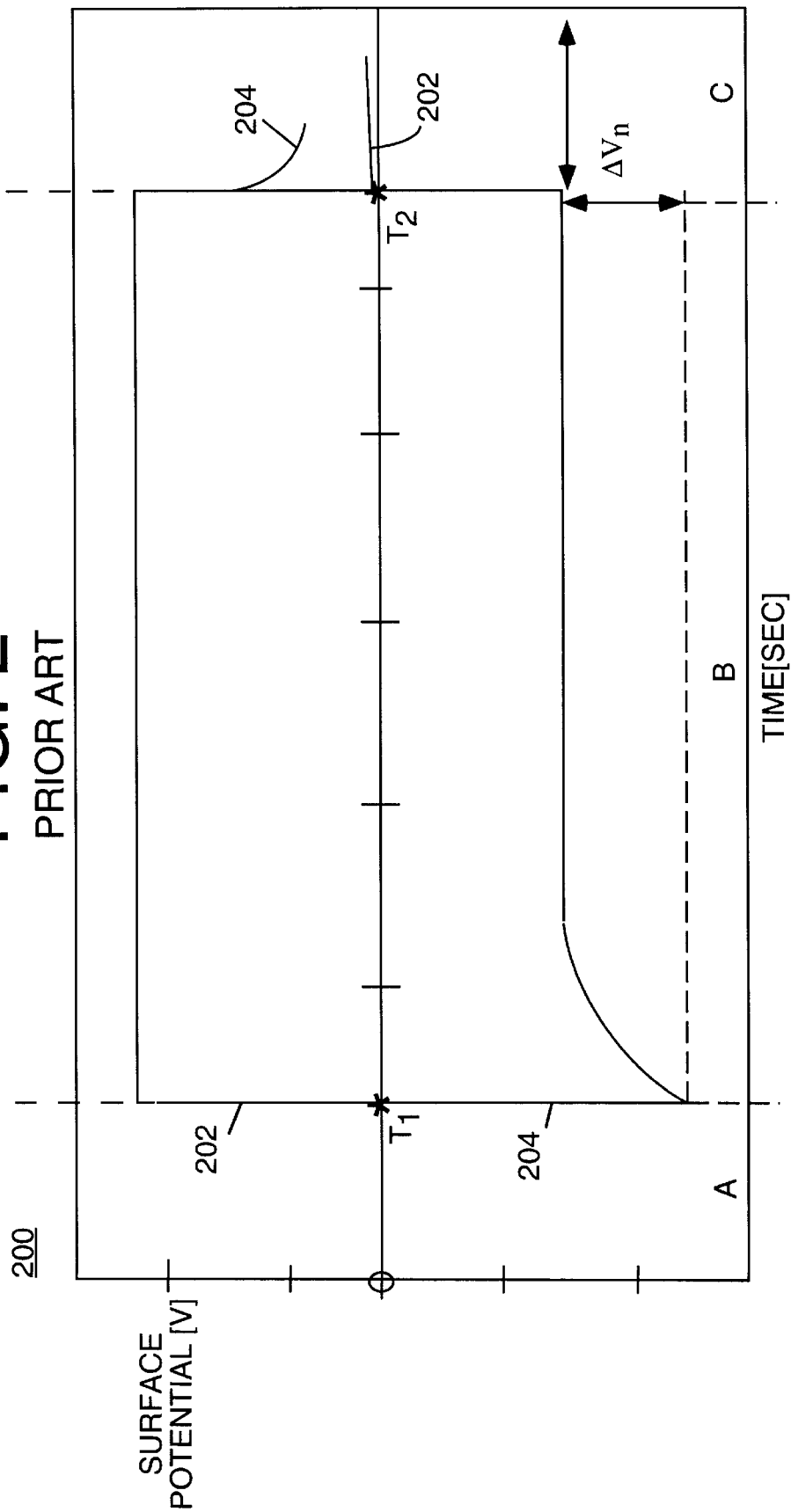
FIG. 2 depicts a graph of the surface potential versus time of a bipolar electrostatic chuck of the prior art depicting a degraded negative potential.

FIG. 3 depicts a cross sectional view of an apparatus in accordance with the subject invention. Specifically, an electrostatic chuck 300 is depicted that is capable of supporting and retaining a substrate (i.e., a semiconductor wafer 306) upon a support surface 304 of the electrostatic chuck 300. The electrostatic chuck 300 comprises a chuck body 302 fabricated from a non-pure dielectric material and conductive material selected from the group consisting of doped aluminum nitride, aluminum and doped boron nitride. The electrostatic chuck 300 also has one or more electrodes 308. The electrodes establish the required current and electric fields to retain the substrate 306 upon the support surface 304. Dopants are added to the dielectric material to reduce its resistivity thereby promoting the Johnsen-Rahbek effect for electrostatic chucking. Such effect makes use of a small, but highly effective current within the chuck body to a large electrostatic potential at the support surface 304. For a detailed description of the Johnsen-Rahbek effect and its use in electrostatic chucks, the reader is referred to U.S. Pat. Nos. 5,656,093 issued Aug. 12, 1993 to Burkhart et al., 5,463,526 issued Oct. 31, 1995 to Mundt and 5,117,121 issued May 26, 1992 to Watanabe et al. which are herein incorporated by reference.

In a preferred embodiment of the invention and as depicted in FIG. 3, the electrostatic chuck 300 is a bipolar electrostatic chuck. Specifically, at least two electrodes $308_1$, $308_2$ are provided within the chuck body 302. Each of the bipolar electrostatic chuck electrodes are connected to a power supply 310. Specifically, each electrode is biased oppositely with respect to the other electrode by connection to opposite terminals of the power supply 310. The resultant current in the chuck body and electric field established thereabove by this biasing scheme retains the substrate 306 upon the support surface 304 of the electrostatic chuck 300. An exemplary bipolar electrostatic chuck is seen and described in U.S. Pat. No. 5,764,471 issued Jun. 9, 1998 to Burkhart and incorporated herein by reference.

The electrostatic chuck 300 of the subject invention is also provided with an additional feature to reduce charge accumulation at an electrode/chuck body interface 314. Specifically, a barrier layer 312 is provided around each of the electrodes $308_1$ and $308_2$. The barrier layers 312 reduce the likelihood of electrochemical interaction between an electrode 308 and the chuck body material 302. The barrier layer 312 is fabricated from a material selected from the group consisting of conductive and semiconductive materials. Accordingly, the barrier layer 312 should not be an insulating material as this would inhibit current flow and eliminate the Johnsen-Rahbek effect. In a preferred embodiment of the invention, the barrier layer is an alloy of the electrode material, such as molybdenum nitride for a molybdenum based electrode. The electrical characteristics and properties of the barrier layer 312 reduce the likelihood of charges accumulating at the electrode/chuck body interface 314; hence, any resultant change in potential at the support surface (i.e., $\Delta V_n$) is also minimized.

Figure 4:
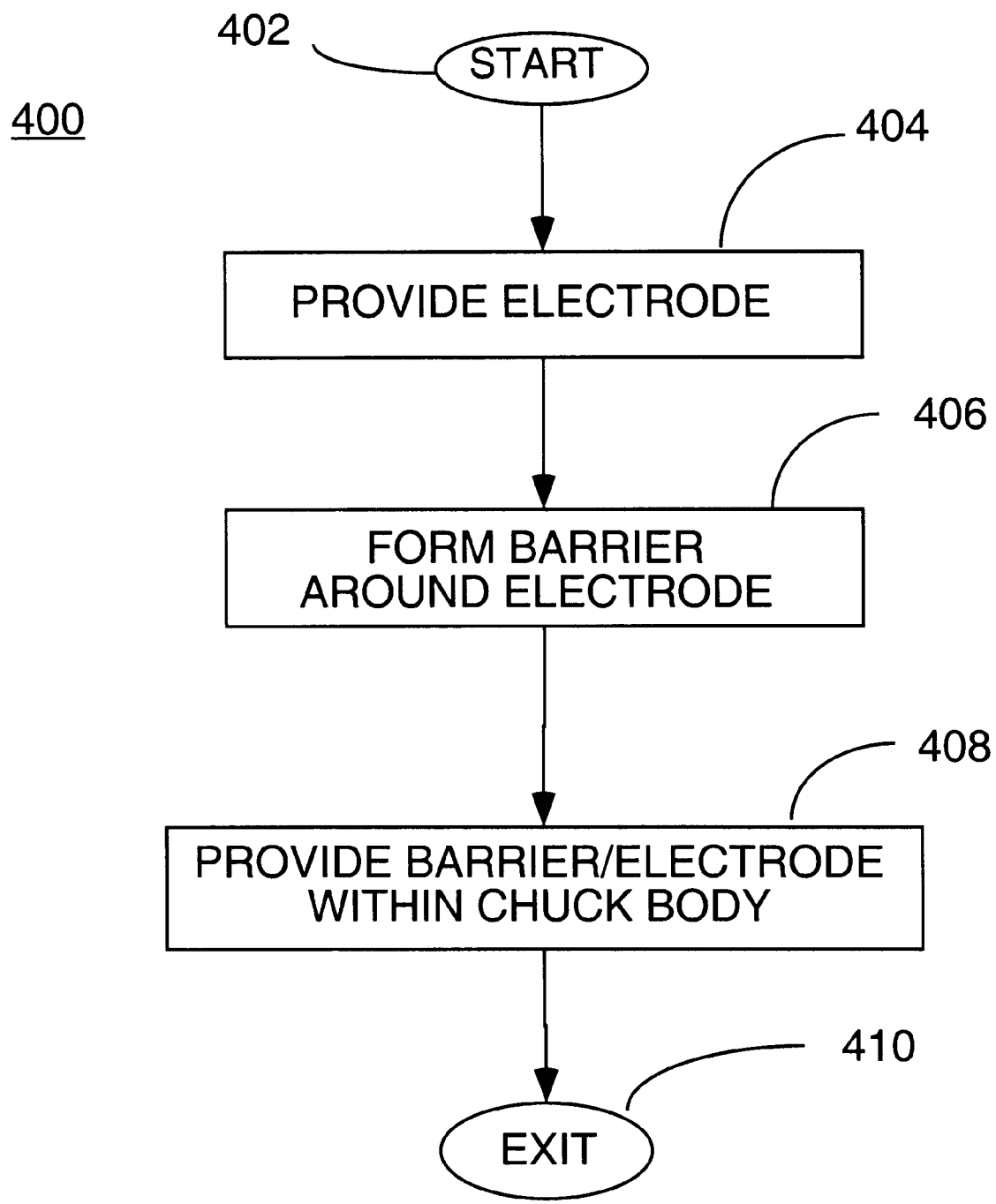
FIG. 4 depicts a series of method steps for forming an apparatus in accordance with the subject invention.

The subject invention also contains a method for forming a substrate support having barrier-enhanced electrodes. Such substrate support could be for example, the bipolar electrostatic chuck as seen and described in FIG. 3 although the method may apply to fabricating a monopolar or multipolar electrostatic chuck too. The method is shown as a series of steps 400 in FIG. 4. Specifically, the method starts at step 402 and proceeds to step 404 where an electrode is provided. The electrode is fabricated from a conducing material and is preferably molybdenum. Alternately, the electrode may be fabricated from tungsten or in the case of a monopolar chuck, a solid aluminum block. In step 406, a barrier is formed around the electrode. Those skilled in the art of electrostatic chuck design and manufacturing are aware of a variety of means by which such electrode barrier can be formed. Such means include but are not limited to coating said electrode with said barrier material, depositing said barrier material upon said electrode, or the like. For example, the barrier material is a conductive or semiconductive material that can be deposited (i.e., via physical vapor deposition, PVD, chemical vapor deposition, CVD, flame spraying, or the like) onto the electrode. The barrier layer may also be formed by exposing the electrode to an environment that is rich in a material that will bond or otherwise react with the electrode material so as to form an alloy of said electrode material. For example, a molybdenum electrode is exposed at high temperature or in a plasma to a nitrogen rich atmosphere. The nitrogen reacts with the molybdenum (i.e., by heat or plasma annealing) to form molybdenum nitride on the exposed surfaces of said electrode. In one particular embodiment of the invention, a molybdenum wire mesh electrode is dipped in an electrolyte solution containing the barrier material. Hence, the wire mesh electrode is completely covered in the barrier material. In an alternate embodiment of the invention, an alternate type of chuck body material can be substituted for the alloy when forming the barrier. Such alternate chuck body material, for example tantalum nitride, boron nitride or titanium nitride having the appropriate dopants dependent upon the temperature range in which the chuck will operate, will not have the undesirable charge accumulation characteristics discussed earlier with respect to the electrode/chuck body interface when using aluminum nitride and molybdenum.

Once the barrier/electrode combination is created, it is provided or otherwise disposed within a chuck body. For example, when forming a bipolar electrostatic chuck, at least two electrodes are disposed within layers of uncured, or "green body state" ceramic tape layers. Once the desired shape of the chuck body is established and the electrodes provided within, the chuck body is sintered. The sintering process cures or otherwise hardens the green body material thereby retaining the electrodes in a permanent fashion within the chuck body. For a more detailed explanation of the formation of electrode and the chuck body layers and sintering of such materials to form an electrostatic chuck the reader is directed to the teachings of U.S. application Ser. No. 08/834,702 filed Apr. 1, 1997. The method ends at step 410 wherein a completed chuck body with barrier layer electrodes are established therein.

The above discussed method and resultant apparatus provides an electrostatic chuck that has a reduced charge accumulation effect at the electrode/chuck body interface. The importance of such a structure is realized in that reduced charge accumulation reduces the "battery effect" from forming at one of the electrodes. Such a battery effect weakens or otherwise degrades the desired electrostatic chucking forces. When such electrostatic chucking forces are not uniform or otherwise weakened, the substrate 306 supported upon surface 304 can move thereby causing processing anomalies. In a worse case scenario, the wafer can pop off the substrate support entirely due to a repelling force created by the positive charge at what should be a negatively charged region. As a result, the wafer can be damaged thereby rendering it useless. Although the subject invention primarily discloses a Johnsen-Rahbek effect bipolar electrostatic chuck, other types of electrostatic chucks may be formed by these teachings. For example, a monopolar electrostatic chuck having an aluminum (or other similarly conductive material) body coated with a dielectric exhibiting the discussed "battery effect" may also include the barrier to reduce such effect.

Although various embodiments which incorporate the teachings of the present invention have been shown and described in detail herein, those skilled in the art can readily devise many other varied embodiments that still incorporate these teachings.

What is claimed is:

1. An apparatus for retaining a substrate comprising:
   a chuck body;
   at least one electrode disposed within said chuck body; and
   a non electrically insulating barrier formed around each of said at least one electrodes.

2. The apparatus of claim 1 wherein said chuck body is fabricated of a dielectric material.

3. The apparatus of claim 2 wherein said dielectric material is doped aluminum nitride.

4. The apparatus of claim 2 wherein said barrier is formed of a non-pure dielectric material that is not the same material of which the chuck body is fabricated.

5. The apparatus of claim 4 wherein the barrier material is selected from the group consisting of dosed boron nitride, doped tantalum nitride and doped titanium nitride.

6. The apparatus of claim 1 wherein said at least one electrode is fabricated of a conductive material.

7. The apparatus of claim 6 wherein said conductive material is molybdenum.

8. The apparatus of claim 6 wherein said barrier is fabricated of a material selected from the group consisting of conductive materials and semiconductive materials.

9. The apparatus of claim 8 wherein said barrier is an alloy of a material of which the electrode is fabricated.

10. The apparatus of claim 9 wherein said alloy is molybdenum nitride.

11. The apparatus set forth in claim 1, wherein the barrier limits physical contact between the chuck body and the electrode.

12. An apparatus for retaining a substrate comprising:
    an aluminum nitride chuck body;
    two molybdenum electrodes disposed within said chuck body; and
    a barrier formed around said electrodes wherein said barrier is fabricated from an alloy of said electrodes.

13. The apparatus of claim 12 wherein the alloy is molybdenum nitride.

14. A method for forming an electrostatic chuck comprising a chuck body, at least one electrode disposed within said chuck body and a non electrically insulating barrier disposed around each of said at least one electrode, the method comprising:
    (a) providing said at least one electrode;
    (b) forming said barrier around each of said at least one electrode; and
    (c) providing said barrier/electrode within said chuck body.

15. The method of claim 14 wherein said at least one electrode is fabricated from a material selected from the group consisting of tungsten and molybdenum.

16. The method of claim 14 wherein (b) further comprises coating the electrode with a barrier material by a method selected from the group consisting of physical vapor deposition, chemical vapor deposition, flame spraying, electroplating, heat annealing and plasma annealing.

17. The method of claim 16 wherein the barrier material is selected from the group consisting of conductive and semiconductive materials.

18. The method of claim 17 wherein the barrier material is an alloy of a material for forming the electrode.

19. The method of claim 18 wherein the alloy is molybdenum nitride.

20. The method of claim 14 wherein the chuck body is fabricated from a dielectric material.

21. The method of claim 20 wherein (b) further comprises forming the barrier from a non-pure dielectric material that is not the same dielectric material from which the chuck body was fabricated.

22. The method of claim 21 wherein the non-pure barrier dielectric material is tantalum nitride and the chuck body material is aluminum nitride.

23. The method of claim 14 wherein step (c) further comprises disposing said barrier/electrode amongst layers of uncured chuck body material and then sintering the chuck body and barrier/electrode.

24. The method set forth in claim 14, wherein the barrier limits physical contact between the chuck body and the electrode.

* * * * *

UNITED STATES PATENT AND TRADEMARK OFFICE
CERTIFICATE OF CORRECTION

PATENT NO. : 6,067,222
DATED      : May 23. 2000
INVENTOR(S): Hausmannn

It is certified that error appears in the above-identified patent and that said Letters Patent are hereby corrected as shown below:

claim 5: column 6, line 19 delete "dosed" and insert --doped--.

Signed and Sealed this

Tenth Day of April, 2001

Attest:

NICHOLAS P. GODICI

Attesting Officer      Acting Director of the United States Patent and Trademark Office